United States Patent
Hulfachor

(10) Patent No.: US 6,261,932 B1
(45) Date of Patent: Jul. 17, 2001

(54) METHOD OF FABRICATING SCHOTTKY DIODE AND RELATED STRUCTURE

(75) Inventor: Ronald Hulfachor, Standish, ME (US)

(73) Assignee: Fairchild Semiconductor Corp., South Portland, ME (US)

(*) Notice: Subject to any disclaimer, the term of this patent is extended or adjusted under 35 U.S.C. 154(b) by 0 days.

(21) Appl. No.: 09/364,232

(22) Filed: Jul. 29, 1999

(51) Int. Cl.$^7$ .................................................. H01L 21/28
(52) U.S. Cl. ............................. 438/570; 438/92; 438/167
(58) Field of Search ................................... 438/199, 200, 438/207, 534, 570, 580, 92, 167

(56) References Cited

U.S. PATENT DOCUMENTS

| | | |
|---|---|---|
| 4,310,362 | 1/1982 | Roche et al. . |
| 5,150,177 | 9/1992 | Robinson et al. . |
| 5,216,271 * | 6/1993 | Takagi et al. .......................... 257/370 |
| 5,500,392 * | 3/1996 | Reynolds et al. ..................... 438/401 |
| 5,665,993 * | 9/1997 | Keller et al. .......................... 257/377 |
| 5,953,600 * | 9/1999 | Gris ....................................... 438/200 |
| 5,970,333 * | 10/1999 | Gris et al. ............................. 438/207 |
| 5,973,372 * | 10/1999 | Omid-Zohoor et al. ............. 257/383 |

FOREIGN PATENT DOCUMENTS 9-116038-A * 5/1997 (JP) .

OTHER PUBLICATIONS

Nunes et al. ; "No Cost" Reduced–Leakage Schottky Diode by Ion Implantation, 1999 IEEE/SEMI Advanced Semiconductor Manufacturing Conference, p.p. 172–177.*

* cited by examiner

Primary Examiner—John F. Niebling
Assistant Examiner—Christopher Lattin
(74) Attorney, Agent, or Firm—Pierce Atwood; Chris A. Caseiro

(57) ABSTRACT

A method of forming an improved Schottky diode structure as part of an integrated circuit fabrication process that includes the introduction of a selectable concentration of dopant into the surface of an epitaxial layer so as to form a barrier-modifying surface dopant layer. The epitaxial layer forms the cathode of the Schottky diode and a metal-silicide layer on the surface of the epitaxial layer forms the diode junction. The surface dopant layer positioned between the cathode and the diode junction is designed to raise or lower the barrier height between those two regions either to reduce the threshold turn-on potential of the diode, or to reduce the reverse leakage current of the transistor. The particular dopant conductivity used to form the surface dopant layer is dependent upon the conductivity of the epitaxial layer and the type of metal used to form the metal-silicide junction.

17 Claims, 3 Drawing Sheets

METHOD OF FABRICATING SCHOTTKY DIODE AND RELATED STRUCTURE

BACKGROUND OF THE INVENTION

1. Field of the Invention

The present invention relates to methods of fabricating semiconductor devices. In particular, the present invention relates to the steps associated with the fabrication of bipolar, Metal Oxide Semiconductor (MOS), and Bipolar Complementary MOS (BiCMOS) structures. More particularly, the present invention relates to those aspects of the fabrication of BiCMOS structures involving the formation of Schottky diodes of selectable characteristics without modification of the existing fabrication steps. The present invention is a "no cost" method of fabricating improved Schottky diode structures.

2. Description of the Prior Art

In an effort to create increasingly faster semiconductor devices that consume less power, it is a goal in the semiconductor industry to create increasingly smaller integrated circuit (IC) devices. This relates to the interest in creating IC devices requiring lower supply voltages; that is as device power supplies move from a nominal 5.0 volts to a nominal 3.3 volts, to a nominal 2.0 volts and less. To that end, the steps associated with the fabrication of IC devices are becoming more critical and complex. With increasing complexity and criticality comes significant potential for a decrease in productivity, including greater fabrication costs and lower device yield. It is therefore a continuing goal in this field to minimize fabrication steps and the time and errors associated therewith.

Improvements are sought in all areas of semiconductor fabrication, particularly so in advanced processes. In the field of advanced BiCMOS devices for example, the integration of the steps associated with the formation of bipolar devices and MOS devices creates the type of complexity that requires considerable fabrication coordination. The addition of more masks, implants, depositions, etchings, and the like for advanced BiCMOS processing increases the costs associated with raw materials, capital equipment, and direct and indirect labor obligations.

As power source potentials decrease, there will be a rise in the need for P-N junction devices such as P-N diodes having lower forward turn-on potentials (Vf) with relatively low reverse bias leakage currents (Ir). In that regard, most existing P-N junction devices have Vf and Ir values that would otherwise be unacceptable in systems powered by voltage sources having a nominal potential of 3.3 volts or less, for example. Specifically, most such junction structures have a Vf of about 0.75 volts for a forward current (If) of about $1.0\ \mu A/\mu m^2$. That turn-on potential offers little leeway as the swing between high and low logic levels decreases with lower potentials of the high-potential power rail. It is also to be noted that reverse leakage current leads to power consumption out of line with the importance of most P-N junction diodes as power availability is reduced.

Schottky diodes, formed at the junction of metal-silicon interfaces, can provide a solution to the turn-on voltage limitations of standard P-N diodes. In BiCMOS fabrication processes they are formed at the surface of an active region of the semiconductor wafer by depositing a metal such as Titanium or Platinum onto an area doped with a dopant at a selected concentration. The metal and the silicon react at the surface of the active region under thermal annealing conditions so as to form a metal-silicide layer. For the most part, Schottky diodes are made with an underlying layer of N-type dopant forming the cathode. Of course, a P-type dopant may also be employed to establish the cathode region of the Schottky diode. In either case, it is generally preferable to provide the cathode region with dopant at a concentration somewhat less than that of source and drain regions of a CMOS structure, for example, in order to provide suitable resistance and capacitance characteristics.

It has been determined that of the two metals noted above, the application of Titanium to create a Titanium-silicide (TiSi2) anode may be used to produce a Schottky diode having a Vf equal to about 0.28 volts at If=$1.0\ \mu A/\mu m^2$. However, its Ir is about $80\ \mu A/\mu m^2$—a value considered to be too high for the lower-potential supply rails coming on line. Alternatively, a Platinum-silicide (PtSi) anode has an Ir of only about $0.004\ \mu A/\mu m^2$, while its Vf is unacceptably high at about 0.60 volts at If=$1.0\ \mu A/\mu m^2$. Therefore, it would be desirable either to adjust the TiSi2-based Schottky to have a lower Ir with substantially the same Vf, or to adjust the PtSi-based Schottky to have a lower Vf with substantially the same Ir.

Several techniques have been described as means to improve some characteristics of Schottky diodes including silicided anodes. These techniques are described, to an extent, in U.S. Pat. No. 4,310,362 issued to Roche et al. and U.S. Pat. No. 5,150,177 issued to Robinson et al. Roche apparently shows that a surface implant may be used to modulate electrical performance. Robinson teaches modulation of the Vf of a Schottky diode using the epitaxial layer as a substrate and with additional doping thereof. However, neither teaches the need to provide the capability to resolve both the Vf and the Ir deficiencies of increasing importance with the continuing trend toward lower-potential supply rails. As importantly, they are riot "no cost" solutions for fabricating suitable Schottky diode structures. Robinson in particular requires additional process steps and modifications to generate a Schottky with lower turn-on values. Therefore, in general, while other solutions may be contemplated to resolve these deficiencies, it is important and preferable that they be resolved substantially within the context of existing fabrication steps so as to avoid adding cost to the process of making a suitable structure.

It is well known that in order to establish desired conductive and non-conductive regions that re designed to either be coupled to, or isolated from, one another, many fabrication steps are required. Although there are any number of fabrication processes suitable for the formation of completed semiconductor devices including Schottky diodes, a summary of 20 major processing events in an exemplar BiCMOS process are set out below, with a brief description of the steps to follow. Those steps, identified by the mask designations noted, are substantially as follows:

| Mask No. | Mask Function |
|---|---|
| 1.0 | N+ Buried Layer Mask |
| 2.0 | P+ Buried Layer Mask |
| 3.0 | Composite Mask |
| 4.0 | Sink Implant Mask |
| 5.0 | Channel Stop and PWell Mask |
| 6.0 | P-type Anti-punch Through & Threshold Adjust Mask |
| 7.0 | N-type Anti-punch Through & Threshold Adjust Mask |
| 8.0 | Base Definition Mask |
| 9.0 | N+ Polysilicon Exclusion Mask |
| 10.0 | Polycrystalline Silicon Gate Definition Mask |
| 11.0 | N LDD Mask |
| 12.0 | P LDD Mask |

-continued

| Mask No. | Mask Function |
|---|---|
| 13.0 | P+ Source/Drain Definition Mask (PMOS) |
| 14.0 | N+ Source/Drain Definition Mask (NMOS) |
| 15.0 | Salicide Oxide Mask |
| 16.0 | Contact Definition Mask |
| 17.0 | METAL 1 (M1) Definition Mask |
| 18.0 | VIA Definition Mask |
| 19.0 | METAL 2 (M2) Definition Mask |
| 20.0 | Bond Pad Definition Mask |

Of course, each one of the noted steps includes a plurality of sub-steps, some more so than others. While there are many steps and stages associated with the complete fabrication of an integrated circuit on a semiconductor wafer, a number of the mask stages set out above and described briefly herein are directly applicable to the present invention.

Initially, alignment keys are established in the wafer to align all subsequent steps. Next, for a BiCMOS device including an NPN bipolar transistor, for example, a buried collector layer is created on the substrate of semiconductor material noted above. For that particular type of bipolar transistor, a substrate of P type semiconductor material is used. This is accomplished by introducing, such as by implantation, an N concentration of relatively slow diffusing N type atoms to form an underlying layer for subsequent retrograde diffusion in the substrate. At the same time, a second buried N type layer is formed as an NWell in the substrate to underlie the region to become the PMOS transistor of the BiCMOS device. Similarly, a buried layer of P type dopant is formed in the region of the substrate to underlie what will become the NMOS transistor of the BiCMOS device. This P type buried layer is formed in between the two N type buried layers and electrically isolates them from one another. Additionally, the P type atoms are introduced into areas adjacent to the buried N type layers previously introduced so as to form channel stops for isolation of adjacent active areas.

Next, an epitaxial layer in the form of single crystal N type semiconductor material in an N⁻ concentration is formed over the buried layers. This is achieved by introducing a silicon-containing fluid, usually silane gas, in a thermal process that causes silicon growth on the surface of the original substrate. However, rather than provide an epitaxial layer of the same conductivity as that of the substrate, conductive elements are introduced with the silicon-containing fluid during that thermal stage. The conductive elements are generally elemental dopants including, but not limited to, phosphorous, boron, arsenic, and antimony. The amount of dopant material introduced with the silane may be different from one particular process to another; however, it is generally introduced in a chemical vapor deposition process including a steady-state flow condition that establishes what is initially designed to be a uniform epitaxial layer conductivity.

The epitaxial layer is grown to a desired thickness and it forms the foundation for the remaining steps used to fabricate the various regions of the device. Integrated circuit fabrication techniques involving the formation of the epitaxial layer usually introduce enough conductive elements such that the dopant levels in the epitaxial layer are on the order of about $1-3\times10^{15}$ atoms/cc to about $1-3\times10^{16}$ atoms/cc.

Other integrated steps are used to form the bipolar transistor. In particular, a collector sink of relatively fast-diffusing N type atoms is introduced into the epitaxial layer above a portion of the buried N layer used for subsequent collector development. The collector sink is created by depositing the N type atoms on the epitaxial surface, or more commonly, by implanting those atoms into the surface. Subsequent annealing drives the atoms down into the epitaxial layer to establish in some fashion a desired dopant profile in that region in conjunction with the buried layer. The combination of the buried layer and the sink establish the bipolar transistor's collector. Of course, the same could be done for a PNP bipolar transistor using P type materials to form that buried layer and the collector sink.

In the generic BiCMOS process presented, formation of the MOS transistor structures requires the fabrication of conductive wells, and the gate, source, and drain components of the NMOS and PMOS transistor structures. Additionally, formation of the bipolar transistor structures requires the fabrication of the base, emitter and collector components. For the MOS structures, the PWell is formed on the buried layer of P type material and allowed to diffuse toward the surface of the epitaxial layer during the PWell and Channel Stop Mask implant and thermal processing steps. It is to be noted that the epitaxial layer in the region of the PMOS transistor acts as an NWell for that structure.

Isolation oxide layers are next formed about the MOS transistor structures by conventional mask, etch, and formation sequences so as to isolate them from adjacent structures. The field oxide regions are formed are formed above the isolation regions using a field oxide region definition mask in order to further isolate adjacent structures. Channel stop regions, formed at the same time and of the same atom type as the PWell, underlie the isolation oxide regions surrounding both the NWell and PWell. The channel stops isolate the wells from parasitic MOS effects caused by adjacent structures.

Continuing with the summary description of this exemplar BiCMOS process, formation of the MOS transistor structures requires the fabrication of the gate, source, and drain components of the NMOS and PMOS transistor structures. Additionally, formation of the bipolar transistor structures requires the fabrication of the base, emitter and collector components. For the MOS structures, the gates are formed of a polycrystalline layer of semiconductor material, using a well-known mask, etch, and deposition sequence. This "polysilicon layer" is formed on the surface of the respective wells, but is separated from the well surfaces by an underlying gate oxide layer. In the BiCMOS process, the polysilicon layer is used to form polycrystalline silicon gates of the MOS transistors and a polysilicon emitter of the bipolar transistor upon suitable subsequent implanting. The gate oxide layer acts as a dielectric, insulating the gate of the particular MOS transistor structure from the source, the drain, and the channel lying therebetween. The integrity of this gate oxide layer must be maintained throughout the integrated fabrication process so as to ensure effective transistor operation.

In order to accommodate the different characteristics of the two types of transistors without degrading the quality of either, it has been determined that there are advantages in creating the polysilicon layer in two separate steps. This "split poly" process involves the introduction of a relatively thin layer of polycrystalline silicon over the gate oxide layer in a blanket deposition. Subsequent processing steps are used to dope underneath the first polycrystalline silicon layer in the channel region for PMOS and NMOS threshold voltage development and for anti-punch through protection. On the bipolar side, relatively slow diffusing P type atoms in a P+ concentration are implanted into the surface of the epitaxial layer through the first polycrystalline silicon layer while the collector sink and CMOS active areas are protected by photoresist.

After poly gate formation, a sealing oxide is formed on the surface of the gates and on the active regions of the MOS wells. This thermally grown sealing oxide protects the gates and CMOS wells during subsequent implantation steps used to form the "lightly-doped drain" (LDD) regions previously mentioned. Specifically, a relatively fast-diffusing N type atom in an N concentration (N LDD) is shallowly implanted in the surface of the PWell and a relatively fast-diffusing P type atom in a P concentration (P LDD) is shallowly implanted in the surface of the NWell. These initial implants are designed to extend slightly beyond the final dimensions of the source and drain regions, resulting in an effective gate channel length in the range 0.4–0.6 micron. In addition to initiating the formation of the well-defined source and drain regions, the shallow LDD also provides a gradual transition from source or drain to the channel region, thereby reducing hot electron effects. Of course, with the much smaller structures fabricated today, the importance of the LDD in reducing hot electron effects increases. The LDD regions are less heavily doped than the specific source and drain regions, but more heavily doped than the insulative oxide regions immediately adjacent to the active areas. It is this portion of the fabrication process that is related to the creation of the Schottky diode structure of the present invention.

In order to produce shallower, and therefore faster, devices, and properly sized source and drain regions, a spacer oxide is deposited to a thickness of about 2000 Å over the future source and drain regions and the poly gates. The spacer oxide is then etched to expose substantially all of the active areas of the device during the silicide exclusion step. Etching of the spacer oxide exposes the top of the gate and the subsequent source and drain regions for following ion implants and metal deposition. Relatively slow-diffusing P type atoms in a $P^+$ concentration in the surface of the NWell and relatively slow-diffusing N type atoms in an $N^+$ concentration are then introduced into the surface of the PWell, using conventional mask, etch and implant sequences, to define the source and drain regions of the PMOS and NMOS transistor structures respectively.

After implantation of the source and drain regions, a preliminary conduction layer is defined by the metal-silicon combination previously described in regard to the formation of the silicide layer that provides a smooth transition between silicon-based layers of the active area and metal contacts. This aspect of the exemplar BiCMOS fabrication process also relates to the present invention. In any event, in the general processing scheme, conventional bond pads that are the metal contacts are formed in order to couple the transistors to external circuitry, including by way of input/output nodes.

For the bipolar side of the process, as noted, the emitter region is subsequently formed over the base region during the blanket polysilicon gate sequences. During the formation of the source and drain regions of the PMOS structure, an extrinsic base region is established over the intrinsic base region surrounding the poly emitter located on the surface of the epitaxial layer. Remaining steps include final formation of isolation and metal contact regions.

For high performance BiCMOS processes similar to that described briefly herein, silicide is typically used for various electrical advantages. That silicide may also be used to form a Schottky diode. However, in order to keep parasitic capacitance low (for PMOS and bipolar devices), the NWell is generally preferably doped at relatively low doping concentrations which may not otherwise provide optimal cathode doping if used as a Schottky diode substrate in association with the silicide. This is particularly so as power supply voltages are scaled down. Therefore, what is needed is an improved Schottky diode structure having a relatively low turn-on threshold and a relatively low leakage-current characteristic. What is also needed is an improved fabrication sequence that enables the formation of such an improved Schottky diode structure. Further, what is needed is such an improved fabrication sequence that involves little modification to existing sequences and thereby adds effectively no cost to the process of forming such an improved structure.

SUMMARY OF THE INVENTION

It is an object of the present invention to provide an improved fabrication process and related structure that results in the formation of an improved Schottky diode structure having a relatively low turn-on threshold and a relatively low leakage-current characteristic. It is also a key object of the present invention to provide such an improved fabrication sequence that involves little to no modification to existing sequences and thereby adds essentially no cost to the process of forming such an improved structure.

These and other objectives are achieved in the present invention through a novel fabrication process that creates a new Schottky diode structure. The Schottky diode structure of the present invention includes a barrier-modifying layer between the surface anode and the cathode body within the epitaxial layer. The barrier-modifying layer is designed to reduce or increase the threshold turn-on potential of the Schottky diode, dependent upon whether the diode junction silicide is formed with Ti or Pt. The barrier-modifying layer is also designed to reduce or increase the reverse leakage current of the structure, again dependent upon the use of Ti or Pt to form the diode junction. The characteristics of the barrier-modifying layer may be adjusted as desired in order to tailor the basic electrical properties of the diode.

The fabrication process involves combining several existing steps together with a modification of an existing mask or masks to modulate the electrical characteristics of the Schottky diode. First, the epitaxial layer is used to establish the cathode of the diode. Ordinarily, the next step would be to apply the metal, generally either Titanium or Platinum, to the surface of the epitaxial layer to establish the diode's cathode. Subsequent metal contact layers would then be applied to provide diode contact means and thereby form the Schottky diode of the prior art. The present invention involves modification of the noted sequence to include the introduction of an additional dopant into the surface of the epitaxial layer prior to application of the metal. Specifically, for a Ti-based silicide, a P-type dopant is introduced into the N-type epitaxy to form the barrier-modifying layer that is a dopant surface layer designed to increase the diode's barrier height. That is, the threshold potential required to turn on the diode is increased. It is to be noted that the introduced dopant concentration must not be so high as to raise that threshold above some defined value, e.g., beyond about 0.6 volts at If=1.0 $\mu A/\mu m^2$. At the same time, the P-type dopant increases the barrier associated with blocking reverse current leakage and therefore favorably reduces the diode's reverse leakage current properties. Of course, if the epitaxy is P-type, the dopant type for the Ti-based silicide would be N-type.

Alternatively, when the silicide is Pt-based, an N-type dopant is introduced into the N-type epitaxy to form the barrier-modifying layer that is a dopant surface layer designed to decrease the diode's barrier height. That is, the threshold potential required to turn on the diode is lowered—a desirable result. At the same time, the N-type dopant also reduces the barrier associated with blocking reverse current leakage and therefore increases the diode's reverse leakage current properties. It is important to note that in this instance the dopant concentration must not be so high as to increase that leakage current above some defined level, e.g., beyond about 2.0 pA/$\mu m^2$. Of course, if the epitaxy is P-type, the dopant type for the Ti-based silicide would be P-type.

In the preferred embodiment of the invention, the dopant surface layer of the novel Schottky diode structure of the present invention is formed during either or both of the LDD implant steps. For a Schottky diode having a Ti-based silicide anode and an N-type epitaxial cathode, for example, the P LDD implant mask of the standard process described above can be modified to allow for introduction of that P LDD dopant into the epitaxial layer where the diode is to be formed. Similarly, for a Schottky diode having a Pt-based silicide anode and an N-type epitaxial cathode, the N LDD implant mask of the standard process described above can be modified to allow for introduction of the N LDD dopant into the epitaxial layer where the diode is to be formed. Again, if the epitaxy is P-type, the particular dopant type to be introduced therein would be reversed accordingly.

It is to be noted that the formation of the novel Schottky diode structures of the present invention may involve integrated BiCMOS processes such as the one described in the Background section above. Alternatively, since the key steps of the process involve the MOS structures, the novel Schottky diode may be formed as part of a CMOS-only sequence. Of course, the cost effectiveness of the new fabrication sequence of the present invention lies in use of existing steps of know fabrication sequences. It would therefore be preferable to use such existing integrated sequences, modified slightly, to create Schottky diodes of either type with improved turn-on thresholds and reverse leakage current properties. These and other advantages of the present invention will become apparent upon review of the following detailed description, the accompanying drawings, and the appended claims.

DESCRIPTION OF THE PREFERRED EMBODIMENTS OF THE INVENTION

Methods of fabricating several types of improved Schottky diode structures of the present invention at essentially no cost are described in conjunction with a series of key fabrication steps shown in FIGS. 1–7. The fabrication process used to form one or more Schottky diodes may be, and preferably are, integrated into BiCMOS or CMOS fabrication steps previously noted, without adding any new steps. New structures and the relevant mask modifications are shown in FIGS. 4–7. The overall exemplar BICMOS transistor structure mask sequence is the sequence summarized in the Summary of the Invention with modifications as indicated. Of course, alternative fabrication steps may be employed, provided a barrier-modifying layer forms a portion of the Schottky diode between the metal-suicide anode and the doped cathode layer. While the present discussion focuses on the formation of an N-type Schottky diode and the associated N-type epitaxial layer, it is to be understood that similar adjustments in the existing fabrication steps may be used to form an improved P-type Schottky diode.

Figure 1:
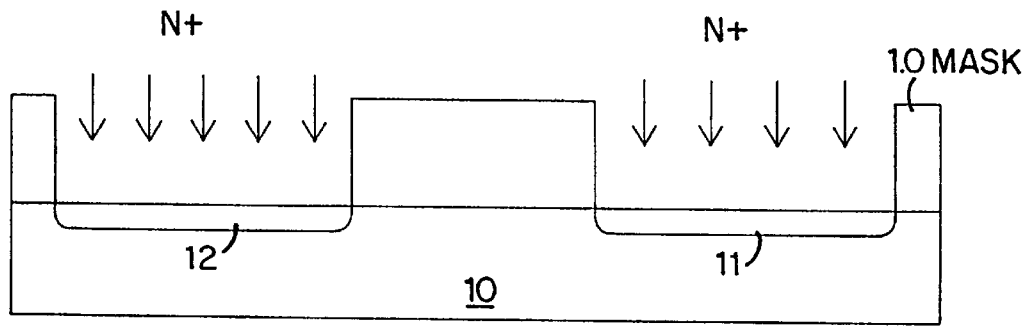
FIG. 1 is a simplified diagrammatic elevation view of the prior-art 1.0 Mask, etch and implant sequence of a CMOS or BiCMOS fabrication process, showing the 1.0 N+ Buried Layer Mask with NPN Buried Collector definition opening and CMOS NWell definition opening.
Figure 2:
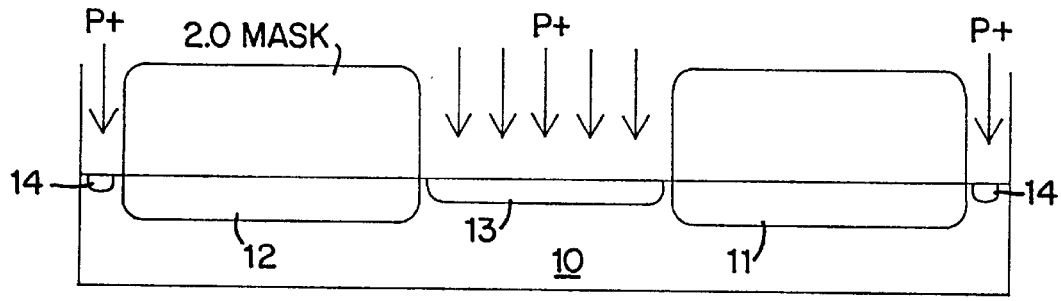
FIG. 2 is a simplified diagrammatic elevation view of the prior-art 2.0 Mask, etch and implant sequence of the fabrication process, showing the 2.0 P+ Buried Layer Mask with CMOS PWell definition opening.

Prior to the novel fabrication sequences used to form the structure including the tailored epitaxial layer of the present invention, a substrate 10 of P type semiconductor material is used as the foundation or basic substrate to form active devices. As shown in FIG. 1, an N type region 11 for a PMOS transistor, and a buried collector layer 12 for an NPN bipolar transistor are formed in the substrate 10 by implanting N type dopant in an N+ concentration through the prior 1.0 Mask. As shown in FIG. 2, a retrograde PWell region 13 for an NMOS transistor is formed in the substrate 10 by implanting P type dopant in a P+ concentration through the prior 2.0 Mask. Channel stop regions 14 are formed at the same time that the PWell region 13 is formed. The channel stop regions 14 are designed to isolate adjacent active structures.

Figure 3:
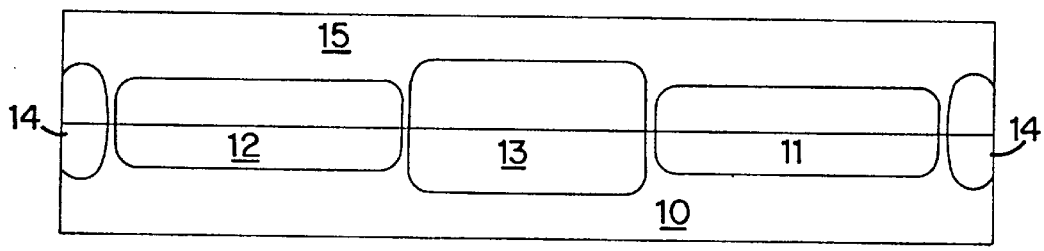
FIG. 3 is a simplified diagrammatic elevation view of the prior-art 3.0 Mask epitaxial growth step, showing the partially diffused buried collector layer, buried NWell, and buried PWell, and channel stop regions adjacent to all wells.

As illustrated in FIG. 3, a single crystal epitaxial layer 15 of N⁻ silicon is next deposited uniformly over all surfaces in a blanket epitaxial deposition with a dopant material during the deposition step. This is achieved using conventional fabrication equipment to introduce silane gas into a fabrication chamber containing the substrate 10 at a temperature and in a manner that causes silicon material to become deposited on the surface of the substrate 10 in an epitaxial manner. Phosphorus is the preferred dopant in the context of the present invention.

Figure 4A:
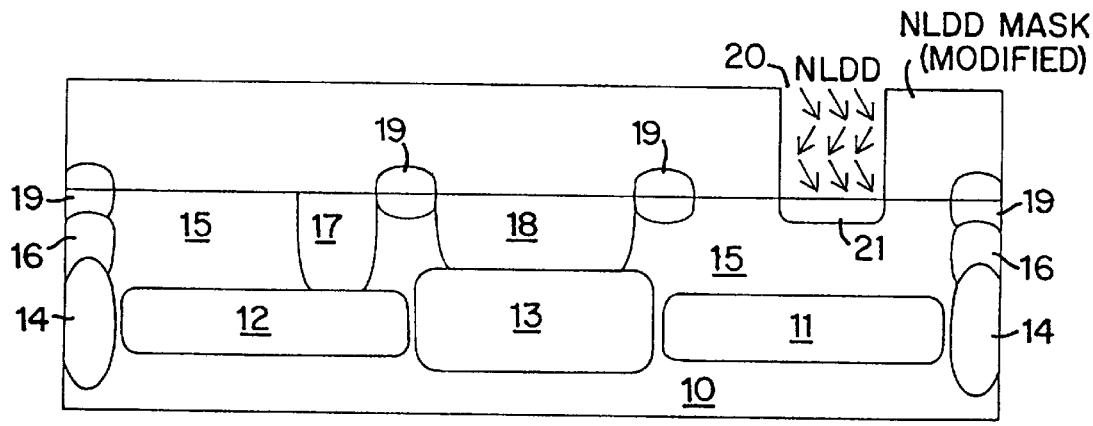
FIG. 4A is a simplified diagrammatic elevation view of the first alternative modified N LDD Mask implant sequence of the present invention, showing the introduction of the N LDD dopant into the N type epitaxial layer.

Continuing with the remainder of the detailed description of the process associated with the formation of the improved Schottky diode structures of the present invention, standard regions of the prior structures are shown in the remaining figures starting with FIG. 4A. Isolation oxide regions 16 are established around the active structures above the channel stop regions 14 and near a surface of the epitaxial layer 15. That is, the isolation oxide regions 16 diffuse to meet the channel stop regions 14, pinching any potential channel in that location. The oxidation process causes upward diffusion of regions 11–13. Additionally, a collector sink region 17 of relatively fast diffusing N type atoms in an N+ concentration is formed in the epitaxial layer 15 above a portion of the buried collector layer 12 for subsequent upward diffusion. The collector sink region 17 forms the basis of the electrical pathway for the collector of the NPN transistor. An implant of relatively fast diffusing P type atoms in a P concentration is formed in the epitaxial layer 15 over the PWell region 13 is used to form a P channel 18 of the NMOS transistor. Further, field oxide regions 19 for framing the active structures are formed in the surface of the epitaxial layer 15 at well-defined sites during subsequent oxidation steps. The field oxide regions 19, which add about 100 nm to the thickness of the isolation oxide regions 16, isolate active devices adjacent to one another.

With continuing reference to FIG. 4A, in a first alternative embodiment of the invention for an N type epitaxial layer, wherein the metal used in the subsequent formation of the metal silicide anode is Platinum, the N LDD Mask is modified to include first barrier-layer opening 20 for the introduction of relatively fast-diffusing Phosphorus atoms. Specifically, the dopant is implanted to an N concentration in those sections of the epitaxial layer 15 not masked by the modified N LDD photoresistive mask. The N LDD Phosphorus implantation is preferably conducted at a level of $1.3 \times 10^{13}$ ions/cm$^2$@60 KeV. Variations in these parameters can be made in order to adjust the doping level in a first surface N LDD layer 21, subsequently changing the threshold turn-on potential and reverse leakage current of the novel Schottky diode to be formed. In this instance, with an N-type Schottky cathode established by epitaxial layer 15 and with a Pt silicide, the N LDD implant lowers the turn-on threshold and increases the reverse leakage current. If Ti were used in the silicide, the same change would occur, but the preferred goal with Ti is to lower the reverse current leakage.

This implantation is ordinarily conducted at two angles, an angle of about +70° from the perpendicular to the plane of the surface of the wafer, and an angle of about −70° from the same perpendicular, in order to minimize shadowing effects associated with the gate regions of the CMOS transistor structures. That angling may be employed in regard to the present invention in order to avoid any unnecessary changes in the existing process that would otherwise increase costs. However, it is to be understood that direct implantations to form the surface N LDD layer 21 will serve the same purpose.

Figure 4B:
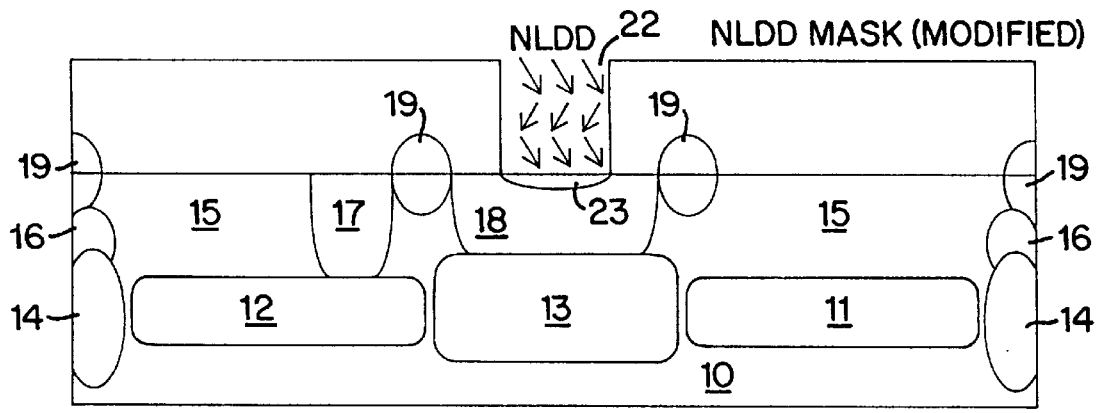
FIG. 4B is a simplified diagrammatic elevation view of the second alternative modified N LDD Mask implant sequence of the present invention, showing the introduction of the N LDD dopant into the P type PWell that may alternatively be a P type epitaxial layer.

FIG. 4B illustrates a second alternative embodiment of the invention for a P type epitaxial layer wherein the metal used in the subsequent formation of the metal silicide anode is Titanium, the N LDD Mask is modified to include second barrier-layer opening 22 for the introduction of relatively fast-diffusing Phosphorus atoms. In this instance, a P type epitaxial layer is essentially what is provided by P channel 18. Therefore, in this instance, the dopant is implanted to an N concentration in those sections of the P channel 18 not masked by the modified N LDD photoresistive mask. The N LDD Phosphorus implantation may be conducted in the same manner noted in regard to the sequence described with reference to FIG. 4A so as to form a second surface N LDD layer 23. For a Ti-based silicide on a P-type cathode, this arrangement acts to raise the threshold turn-on potential and reduce the reverse leakage current of the novel Schottky diode to be formed. Of course, for a Pt-based silicide the same would occur.

Figure 5A:
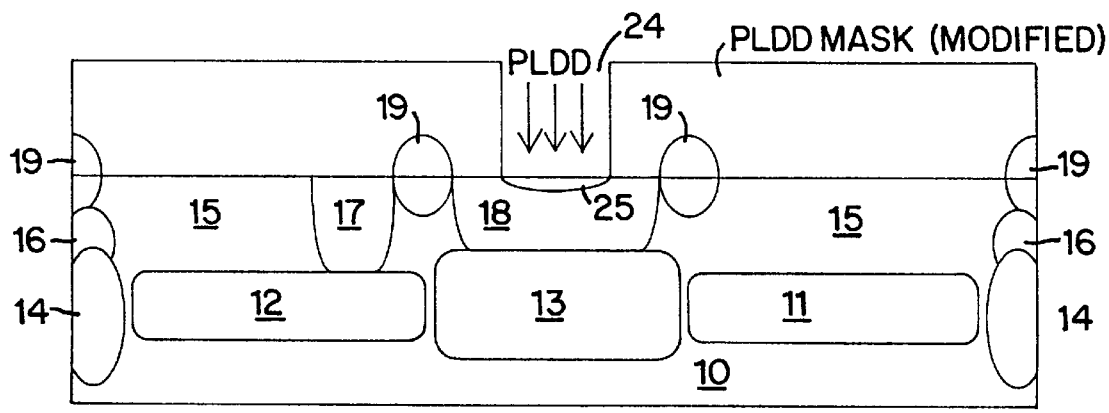
FIG. 5A is a simplified diagrammatic elevation view of the first alternative modified P LDD Mask implant sequence of the present invention, showing the introduction of the P LDD dopant into the P type PWell that may alternatively be a P type epitaxial layer. N type epitaxial layer.

FIG. 5A illustrates a third alternative embodiment of the present invention for the case in which the P LDD implant is used to adjust the characteristics of the Schottky diode dependent upon the type of cathode and silicide layer to be deployed. In the case where the cathode is P type as embodied in the P channel 18, and the metal used in the subsequent formation of the metal silicide anode is Platinum, the P LDD Mask is modified to include third barrier-layer opening 24 for the introduction of relatively fast-diffusing Boron atoms. Specifically, the dopant is implanted to a P concentration in those sections of the P channel 18 not masked by the modified P LDD photoresistive mask. The P LDD implantation is preferably conducted directly at a level of $1.3 \times 10^{13}$ ions/cm$^2$@60 KeV. Variations in these parameters can be made in order to adjust the doping level in a third surface P LDD layer 25, subsequently changing the threshold turn-on potential and reverse leakage current of the novel Schottky diode to be formed. In this instance, with a P-type Schottky cathode established by P channel 18 and with a Pt silicide, the P LDD implant lowers the turn-on threshold and increases the reverse leakage current. If Ti were used in the silicide, the same change would occur but, as noted, the preferred goal with Ti is to lower the reverse current leakage.

Figure 5B:
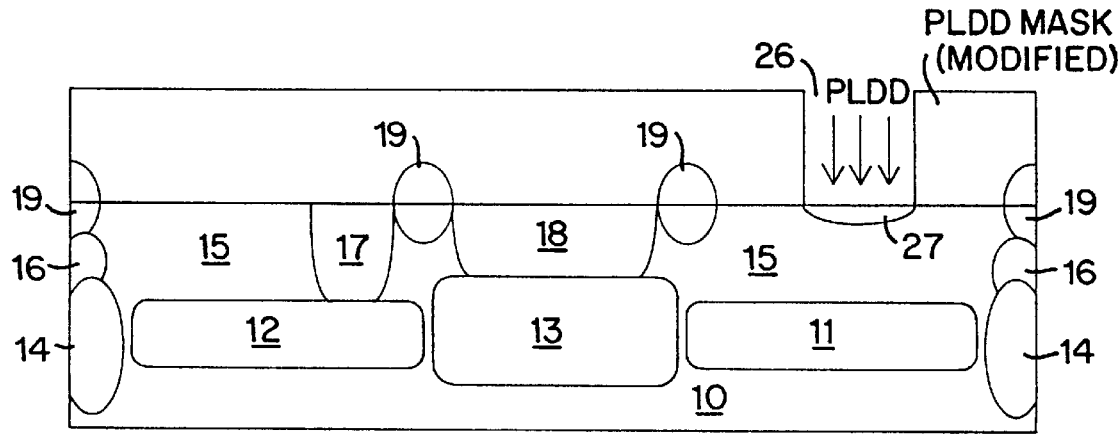
FIG. 5B is a simplified diagrammatic elevation view of the second alternative modified P LDD Mask implant sequence of the present invention, showing the introduction of the P LDD dopant into the N type epitaxial layer

FIG. 5B illustrates a fourth alternative embodiment of the invention for an N type epitaxial layer wherein the metal used in the subsequent formation of the metal silicide anode is Titanium, the P LDD Mask is modified to include fourth barrier-layer opening 26 for the introduction of relatively fast-diffusing Boron atoms. In this instance, the N type epitaxial layer is the epitaxial layer 15. Therefore, the dopant is implanted to a P concentration in those sections of the epitaxial layer 15 not masked by the modified P LDD photoresistive mask. The P LDD implantation may be conducted in the same manner noted in regard to the sequence described with reference to FIG. 5A so as to form a fourth surface N LDD layer 27. For a Ti-based suicide on an N-type cathode, this arrangement acts to raise the threshold turn-on potential and reduce the reverse leakage current of the novel Schottky diode to be formed. Of course, for a Pt-based silicide the same would occur.

Figure 6:
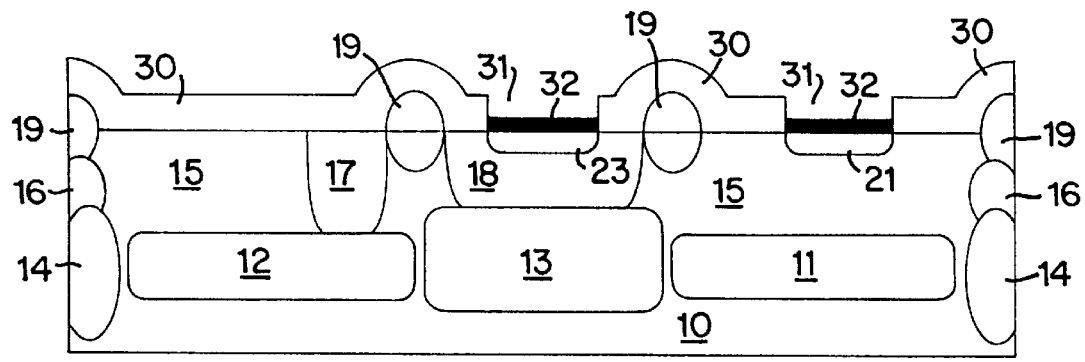
FIG. 6 is a simplified diagrammatic elevation view of the modified Silicide formation sequence of the present invention, showing the metal silicide formation on the surface of the cathode of the structure to form the Schottky diode of the present invention.
Figure 7:
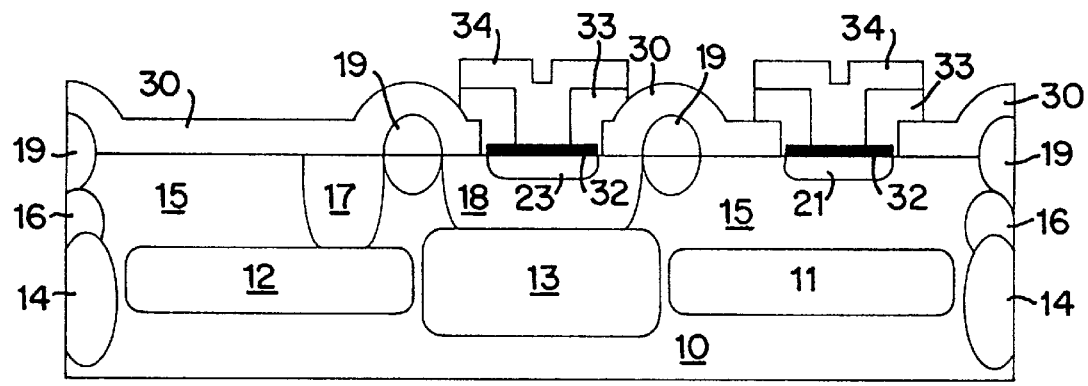
FIG. 7 is a simplified diagrammatic elevation view of the two alternative Schottky diodes of the present invention after Metal 1 and Metal 2 depositions.

FIGS. 6 and 7 illustrate the remaining principal aspects of the formation of the improved Schottky diode structures of the present invention with specific reference to an N-type Schottky represented in part by barrier layer 21, and to a P-type Schottky represented in part by barrier layer 23. In order to complete the device, the Contact Definition Mask and etch sequence is modified to remove insulative lower temperature oxide (LTO) layer 30 over metal anode areas 31 corresponding to the Schottky diode anode regions. The anode areas 31 are preferably formed after blanket deposition of Titanium or Platinum, or some other suitable metal, such as Aluminum, Tantalum, Molybdenum, or the like, in order to form a refractory metal blanket over all surfaces. After blanket deposition and sintering, all "unsilicided" metal is removed, such as that on the anode areas 31, leaving metal-silicide composite 32 in all contact areas 31. The final relevant steps in the process are shown include the M1 Definition Mask sequence of depositing a first Metal 1 (M1) layer 33, preferably a suitable metal combination, such as Titanium/Tungsten and Aluminum/Copper. A second metal layer 34 is deposited and defined using the M2 Mask and deposition sequence. Finally, bond pads are defined, etched, and created. Then result is a Schottky diode structure having sufficiently low threshold turn-on and minimized reverse leakage current as a function of the underlying cathode substrate and the metal used to form the silicided anode.

While the invention has been described with reference to particular example embodiments, it is intended to cover all modifications and equivalents within the scope of the following claims. In particular, it is to be understood that the formation of the novel improved Schottky diode structures of the present invention may be created using alternative integrated structure fabrication sequences.

What is claimed is:

1. A process for fabricating a Schottky diode structure as part of a series of fabrication steps, the process comprising the steps of:
   a. establishing a semiconductor substrate of a certain conductivity type and lattice orientation;
   b. introducing onto a surface of said semiconductor substrate an epitaxial layer of semiconductor material of a selectable conductivity type;
   c. introducing into a surface of said epitaxial layer a selectable concentration of a dopant of a certain conductivity type so as to form a surface dopant layer therein, wherein said surface dopant layer is adjustable to modify a barrier potential associated with the Schottky diode structure and wherein said surface dopant layer is formed while forming one or more low-density drain (LDD) regions as part of the series of fabrication steps; and
   d. applying a metal layer to said surface of said epitaxial layer and reacting said metal layer with said epitaxial layer so as to form a metal-silicide layer on said surface dopant layer.

2. The process as claimed in claim 1 wherein the step of introducing said dopant into said surface of said epitaxial layer includes the step of implanting said dopant through a barrier-layer opening of an LDD definition mask.

3. The process as claimed in claim 2 wherein said epitaxial layer is of N type conductivity, said metal layer is Platinum, and said dopant is of N type conductivity.

4. The process as claimed in claim 2 wherein said epitaxial layer is of N type conductivity, said metal layer is Titanium, and said dopant is of P type conductivity.

5. The process as claimed in claim 2 wherein said epitaxial layer is of P type conductivity, said metal layer is Platinum, and said dopant is of P type conductivity.

6. The process as claimed in claim 2 wherein said epitaxial layer is of P type conductivity, said metal layer is Titanium, and said dopant is of N type conductivity.

7. A process for fabricating a Schottky diode structure as part of a series of series of BiCMOS fabrication steps including the formation in an epitaxial layer of semiconductor material of a selectable conductivity of an integrated structure with at least a bipolar transistor, a first MOS transistor structure having a first well of first conductivity type, and a second MOS transistor having a second well of second conductivity type, wherein the formation of the first MOS transistor includes the step of introducing a first LDD dopant in a surface of the first well and the formation of the second MOS transistor includes the step of introducing a second LDD dopant in a surface of the second well, wherein a metal silicide blanket is applied to the integrated structure, and wherein the epitaxial layer is formed on a surface of a semiconductor substrate of a certain conductivity type and lattice orientation, the process comprising the steps of:
   a. forming a third well of the first conductivity type in the epitaxial layer when forming the first well;
   b. introducing into a surface of said third well one of either the first LDD dopant or the second LDD dopant when introducing the first LDD dopant into the first well or the second LDD dopant into the second well so as to establish a barrier layer of selectable barrier potential associated with the Schottky diode structure; and
   c. applying the metal silicide blanket to said surface of said third well.

8. The process as claimed in claim 7 wherein the first conductivity type is N type and the second conductivity is P type.

9. The process as claimed in claim 8 wherein the metal silicide layer is formed with the metal Platinum, wherein the first LDD dopant is introduced into said surface of said third well, and wherein the first LDD dopant is of N type conductivity.

10. The process as claimed in claim 8 wherein the metal silicide layer is formed with the metal Titanium, wherein the first LDD dopant is introduced into said surface of said third well, and wherein the first LDD dopant is of P type conductivity.

11. The process as claimed in claim 7 wherein the first conductivity is P type and the second conductivity is N type.

12. The process as claimed in claim 11 wherein the metal silicide layer is formed with the metal Platinum, wherein the first LDD dopant is introduced into said surface of said third well, and wherein the first LDD dopant is of P type conductivity.

13. The process as claimed in claim 11 wherein the metal silicide layer is formed with the metal Titanium, wherein the first LDD dopant is introduced into said surface of said second well, and wherein the first LDD dopant is of N type conductivity.

14. The process as claimed in claim 7 further comprising the steps of:
   a. forming a fourth well of the second conductivity type in the epitaxial layer when forming the second well;
   b. introducing into a surface of said fourth well the other of the first LDD dopant or the second LDD dopant when introducing the first LDD dopant into the first well and the second LDD dopant into the second well; and
   c. applying the metal silicide blanket to said surface of said fourth well.

15. The process as claimed in claim 14 wherein the first conductivity type is N type and the second conductivity is P type.

16. The process as claimed in claim 15 wherein the metal silicide layer is formed with the metal Platinum, wherein the first LDD dopant is introduced into said surface of said third well, the second LDD dopant is introduced into said surface of said fourth well, wherein the first LDD dopant is of N type conductivity, and wherein the second LDD dopant is of P type conductivity.

17. The process as claimed in claim 15 wherein the metal silicide layer is formed with the metal Titanium, wherein the first LDD dopant is introduced into said surface of said third well, wherein the second LDD dopant is introduced into said surface of said fourth well, wherein the first LDD dopant is of P type conductivity, and wherein the second LDD dopant is of N type conductivity.

* * * * *